US008361565B2

(12) United States Patent
Kuhlenschmidt et al.

(10) Patent No.: US 8,361,565 B2
(45) Date of Patent: Jan. 29, 2013

(54) METHOD FOR PLASMA TREATMENT AND PAINTING OF A SURFACE

(75) Inventors: Birgit Kuhlenschmidt, Hamburg (DE); Daniel Lahidjanian, Hamburg (DE); Dirk Bausen, Harsefeld (DE); Karl Hausmann, Hamburg (DE); Bettina Kroeger-Kallies, Bremen (DE)

(73) Assignee: Airbus Operations GmbH, Hamburg (DE)

( * ) Notice: Subject to any disclaimer, the term of this patent is extended or adjusted under 35 U.S.C. 154(b) by 376 days.

(21) Appl. No.: 12/705,020

(22) Filed: Feb. 12, 2010

(65) Prior Publication Data

US 2010/0209618 A1 Aug. 19, 2010

Related U.S. Application Data

(60) Provisional application No. 61/152,327, filed on Feb. 13, 2009.

(30) Foreign Application Priority Data

Feb. 13, 2009 (DE) ......................... 10 2009 008 907

(51) Int. Cl.
*H05H 1/00* (2006.01)
*C23C 14/02* (2006.01)

(52) U.S. Cl. ......................... 427/535; 427/539; 427/534

(58) Field of Classification Search .................. 427/532, 427/533, 534, 535, 539, 540, 569, 299, 327, 427/444
See application file for complete search history.

(56) References Cited

U.S. PATENT DOCUMENTS

| | | | | |
|---|---|---|---|---|
| 6,262,386 | B1 * | 7/2001 | Fornsel | 219/121.52 |
| 6,424,091 | B1 | 7/2002 | Sawada et al. | |
| 6,875,303 | B2 * | 4/2005 | Samurkas et al. | 156/272.6 |
| 2011/0111236 | A1 * | 5/2011 | Pahl et al. | 428/457 |

FOREIGN PATENT DOCUMENTS

| | | | |
|---|---|---|---|
| DE | 10011275 | A1 | 9/2001 |
| DE | 29624481 | U1 | 3/2004 |
| DE | 69929271 | T2 | 9/2006 |
| DE | 102007051763 | A1 | 6/2008 |
| EP | 1067829 | A2 | 1/2001 |
| WO | WO 2006005606 | A2 * | 1/2006 |

* cited by examiner

*Primary Examiner* — Dah-Wei Yuan
*Assistant Examiner* — Nga Leung V Law
(74) *Attorney, Agent, or Firm* — Leydig, Voit & Mayer, Ltd.

(57) ABSTRACT

A method for plasma treatment and painting of a surface, the surface including a plurality of different materials includes blasting the surface with a carbon dioxide snow so as to activate the surface to improve an adhesive strength; and treating the surface with a plasma treatment using at least one plasma nozzle following the blasting step, the treating including guiding the at least one plasma nozzle at a distance of not more than 15 mm from the surface at a feed rate of not more than 50 m/min.

18 Claims, 3 Drawing Sheets

METHOD FOR PLASMA TREATMENT AND PAINTING OF A SURFACE

Priority is claimed to German Patent Application No. DE 10 2009 008 907.1-45, filed Feb. 13, 2009, and to U.S. Provisional Application No. 61/152,327, filed Feb. 13, 2009. The entire disclosure of both applications is incorporated by reference herein.

The invention relates to a method for plasma treatment and painting of a surface, in particular a vertical tail plane of an aircraft, comprising at least one plasma nozzle, wherein the surface is made from a plurality of different materials, in particular carbon fibre reinforced and/or metallic materials and/or has a plurality of connection means and sealing joints.

BACKGROUND

Surfaces to be coated with polymers must generally be subjected to a comprehensive, that is, time-consuming pre-treatment in order to achieve a sufficiently firm adhesion. A pre-cleaning of the surface to be coated with a suitable chemical solvent is usually carried out initially in order to remove, for example, contamination by grease, oils, release agents, fingerprints or dust particles. This is usually followed by purely mechanical pre-treatment by sanding in order to enlarge the surface area of the substrate available for adhesion of the polymer or paint by increasing the surface roughness. Sanding of the surface can be carried out with different grain sizes manually and/or in a motor-driven manner by suitable machines such as, for example, a random orbit sander or belt sander. In order to reduce environmental pollution, extraction devices are frequently used during the sanding process. In order to again remove sanding residue from the surface, which is never completely avoidable notwithstanding any extraction, a further cleaning of the surface with a solvent must be carried out after the sanding process.

This conventional procedure during the pre-treatment of a surface to be painted on the one hand has the disadvantage that the working areas used for the painting work are contaminated with solvent vapour which evaporates during the substrate cleaning processes. In addition, several time-intensive cleaning and sanding procedures are generally required for preparation of the actual painting process, sanding dust being emitted into the environment by these procedures despite the extraction systems.

Methods for pre-treatment of surfaces to be painted are known from the prior art in order to improve the adhesion properties on the surface by treatment with a plasma jet. An apparatus and a method for plasma treatment of surfaces is known, for example, from DE 699 29 271 17 whereby, inter alia, the bond strength of wires on the plasma-treated surface can be increased during chip fabrication. However, this method cannot be applied to the treatment of large-scale components which are additionally formed with a plurality of different materials and/or connection means.

SUMMARY OF THE INVENTION

An aspect of the invention is to provide a time-saving method, which can additionally be carried out with standard process parameters, for the pre-treatment of a large-scale component using a plasma, the component being made using a plurality of different materials and connection means, in order to improve the adhesion of a polymer to be applied to the component, in particular in the form of a paint and/or sealing joints, and at the same time prevent contamination of the environment by sanding dust and/or solvent vapour.

By guiding the at least one plasma nozzle at a distance of up to 15 mm from the surface at a feed rate $V_X$ of up to 50 m/min in order to activate the surface to improve adhesion, the surface energy of the surface is increased by the accumulation of functional groups, with the result that the adhesion of a polymer to be applied, in particular a paint and/or a sealing joint is enhanced. However, no mechanical-structural modification of the surface, that is for example, an increase in the adhesion-relevant surface area of the component as in the conventional sanding method, takes place during the plasma treatment.

Nevertheless, when a surface is activated by a plasma treatment having the process parameters specified in patent claim 1, an adhesive strength is achieved for the polymer to be applied which is comparable to the adhesive strength attainable by a conventional sanding process or is even higher in isolated cases. Compared to the conventional sanding procedure, however, in cases of low contamination there is no need for chemical pre- or after-treatment with a solvent and no sanding dust is released. In addition, the noise loading in the method according to the invention is significantly lower compared to conventional sanding. Furthermore, no extraction devices are required to reduce the dust loading in the working areas. Apart from further but subsidiary chemical effects, the improvement in adhesion according to the method according to the invention is substantially based on oxidation processes and the accumulation of oxygen-containing functional groups at the surface of the plasma-treated surface.

An advantageous further development of the method provides that at least one nozzle head of the at least one plasma nozzle rotates in a holder at a rotational speed of up to 3,600 rpm in addition to the linear feed movement of the holder.

As a result of the rotating plasma nozzle additional to the linear feed movement, the quasi-simultaneous area of action of the plasma on the surface can be enlarged and also made uniform. In addition, uninterrupted plasma treatment of the surface is made possible. Consequently, larger areas such as, for example, an entire vertical tail plane for an aircraft can be improved with regard to adhesion properties in the shortest time and with high quality by means of the method according to the invention.

A rotating nozzle system of the type "RD 1004" made by Plasmatreat® is preferably used for the method according to the invention. The rotating nozzle system preferably comprises at least one rotating nozzle which is rotatably accommodated in a holder as well as a plasma generator for supplying the rotating nozzle with electrical energy and air. The holder together with the plasma nozzle accommodated rotatably therein is automatically positioned in relation to the surface by means of a handling device, for example in the form of a buckling arm robot having at least six degrees of freedom or a portal device and is moved along pre-defined trajectories. Alternatively, the plasma nozzle can also be fastened to a portal robot which is freely positionably in space, with the result that the positioning accuracy can be increased compared to conventional buckling arm robots, particularly in the case of large-sized components.

The plasma nozzle is preferably guided over the surface at a constant distance of 8 mm at a feed rate of 20 m/min. In this case, the nozzle rotates at a rotational speed of 2,890 rpm. The resulting trajectory has the form of a cycloid. A relative speed between the rotating plasma nozzle and the surface lies between 80 and 120 rpm, the temperature of the plasma jets varies in a range between 70° C. and 1,000° C. depending on the distance of the plasma nozzle from the surface and the exit speed of the plasma jet lies in a range between 120 m/s and 300 m/s. The high temperature of the plasma jet means that the distance of preferably 8 mm according to the invention between the lower edge of the plasma nozzle and the component surface must be maintained with high accuracy to avoid local overheating and irreversible damage to the surface caused by this. A thermometer, in particular an infrared thermometer operating in a non-contact manner, can be provided in the region of the rotating nozzle head to automatically re-adjust the distance between the plasma nozzle and the surfaces to be treated in a range of 6 mm to 1.0 mm in connection with a control circuit so that a pre-defined surface limiting temperature of usually 80° C. is not exceeded.

The aforesaid detailed process parameters ensure effective plasma treatment even of a substantially extremely inhomogeneous surface formed from a plurality of different materials, connection means and sealing joints, for example, a vertical tail plane, an elevator unit or other aerodynamic active surfaces (e.g. landing flaps) of an aircraft without local material damage occurring, for example, as a result of local overheating. These process parameters equally ensure optimal plasma treatment of the surface regardless of the material used locally in each case or the presence of connection means and/or sealing joints.

Alternatively and/or in combination with the rotating plasma nozzle described hereinbefore for activating the surfaces to be coated, in the course of the method according to the invention at least one substantially punctiformly acting, that is, non-rotating plasma nozzle can also be used, in particular for the plasma treatment of fastening elements such as, for example, rivets, screws or bolts. In this arrangement the plasma nozzle has at least one static nozzle head having an approximately frustro-conical geometry. The concept of a substantially punctiformly acting plasma nozzle should be understood in this context such that when the plasma nozzle is stationary, the area of action approximately has the form of a circular area having a diameter of up to 20 mm so that the area of action is optimal for activating fastening elements having usually circular heads.

According to a further advantageous embodiment of the method, it is provided that before the plasma treatment the surface is provided with at least one polymer coating at least in certain areas, in particular with a filler, a primer, an anti-static paint, an anti-erosion paint, a top-coat lacquer, a decorative lacquer, a sealing joint or with any combination thereof.

By this means, a seal to protect the surface to be painted is achieved inter alia as part of the pre-fabrication. The application of the anti-erosion paint increases the abrasion resistance of the surface and the application of the anti-static paint prevents the formation of static electric charges due to a defined increase in the electrical conductivity. The polymer sealing joints required inside the surface are also usually applied before carrying out the actual plasma treatment in the form of sealing beads of a polymer material located in joints. In addition, a plurality of fastening elements such as, for example, screws or rivets with or without washers are arranged in the surface. In general, the connection means inside the surface to be painted are also provided with a coating, for example, with a sulphuric acid anodizing and/or a polymer coating (so-called “high coating”).

A further development of the method provides that the holder with the nozzle head is guided above the surface along parallel, rectilinear tracks, wherein one direction of movement of the plasma nozzle is reversed in each case at a track end and one direction of rotation of the nozzle head remains constant.

This ensures a meandering, path-optimised and intensive plasma treatment which leaves no untreated locations. A distance between the tracks in this case lies between 1 cm and 2 cm in order to ensure uninterrupted plasma treatment of the surface of the component due to sufficient overlapping.

According to a further advantageous development, the surface is covered by means of the rotating plasma nozzle at least once, preferably three to five times.

As a result, the surface can be activated and the attainable adhesion values for the polymer coating to be applied can thus be increased.

An advantageous further development of the method provides that before the plasma treatment, the surface is subjected to at least one pre-cleaning, at least in certain areas, in particular with a chemical solvent to remove contaminants.

The pre-cleaning is preferably carried out extensively using isopropanol (“High VOC”) in order to remove any adhering contaminants such as, for example, due to oils, grease, fingerprints or dust particles and thereby reduce the time of action of the plasma to achieve an optimal surface activation. It is also possible to use solvents which, in contrast to the “high VOC’s” substantially only contain slowly volatile components (so-called “low VOC” “Volatile Organic Compounds”) cleaners).

A further development of the method provides that before the plasma treatment, the surface, particularly in the region of the connection means, is blasted with carbon dioxide snow, at least in certain areas.

By this means, coated connection means formed by aluminium alloys and/or stainless steel alloys can be prepared such that sufficient adhesion is achieved for subsequent painting steps. The connection means can, for example, be provided by means of sulphuric acid anodization or with a polymer coating. As comprehensive tests conducted by the applicant have shown, titanium connection means anodized merely with sulphuric acid cannot be activated according to the method either by blasting with carbon dioxide snow or by repeated plasma treatment to such an extent that sufficient adhesion of paints and/or sealing joints can be achieved.

Optimal activation results are achieved with regard to the connection means at a feed rate of 5 m/min to 25 m/min. The cleaning effect is based on the cooperation of three effects. Firstly, a mechanical cleaning occurs due to the mechanical impact of the carbon dioxide particles on the surface, then contamination is removed by the sublimation of the carbon dioxide snow and finally chemical dissolution processes take place.

A further advantageous development of the method provides that the plasma treatment takes place at atmospheric pressure, in particular with air.

The use of ambient air simplifies the procedure appreciably since the surface to be treated with the plasma jet need not be accommodated in a closed container. Alternatively, the method according to the invention can also be carried out with oxygen, with halogens or halogen mixtures.

A further advantageous embodiment of the method provides that the pre-treated surface is provided with the at least one polymer coating within an open time of up to 20 h, preferably within an open time of up to 2 h.

The “open time” designates the period of time for which sufficient activation of the plasma-treated surface exists. Compared to conventional mechanical pre-treatment processes, the method according to the invention particularly has the advantage that the effect of the activation of the surface is maintained for longer time intervals (up to about 96 h) so that final painting or coating the plasma-treated surface to be painted can take place in this broad time frame.

As a result, the painting processes can be adapted more flexibly to the available work resources. Usually, however, other process parameters speak against using this time window so that final painting of the pre-treated surface is usually completed in a time window of up to 2 h. The polymer coatings are conventionally applied using a spray gun and/or using a roller and brush. Alternatively, for example, electrostatic methods can also be used.

The term polymer coating should be interpreted broadly in the context of this application and comprises in particular solvent-containing single-component paint systems, two- and multi-component paint systems having a hardener, a resin component and further optional components as well as optionally also adhesive films or self-adhesive films for surface coating. The sealing joints are preferably made using a polysulphide on a two-component basis. The polymer coatings preferably comprise the usual coatings already listed as examples above, which are used according to the present state of the art in the area of aircraft vertical tail planes.

A further embodiment of the method provides that the polymer coating is preferably applied to the pre-treated surface directly after opening a relevant container in the lowest possible viscosity state.

Irrespective of the fact that the plasma treatment of a surface does not lead to any modification of the surface structure oldie component which can be detected immediately, for example, using a scanning electron microscope, the effective, that is the adhesively "active" area of the material is nevertheless increased due to the accumulation of molecular groups or functional groups.

In order to ensure an optimal paint quality of the painting or coating, it is provided that that the polymer coating is applied in the lowest possible viscosity state ("early" pot life) in order to achieve an effective smoothing of the paint surface due to running of the paint.

DETAILED DESCRIPTION

Figure 1:
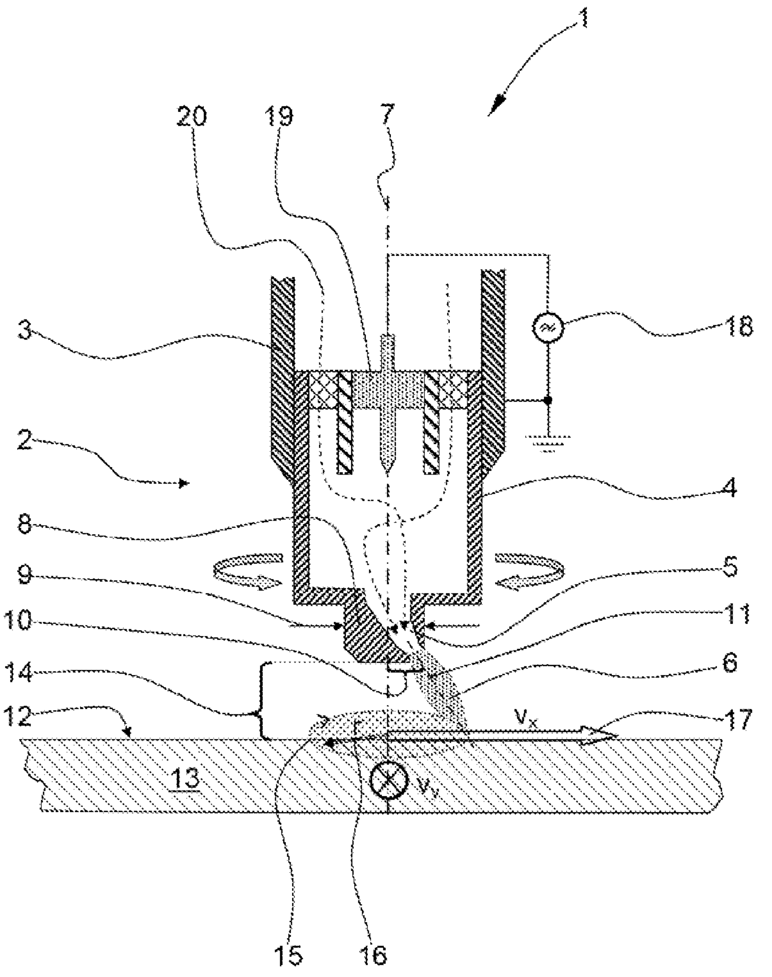
FIG. 1 shows a schematic cross-sectional diagram of the plasma nozzle used for carrying out the method.

FIG. 1 shows a cross-section through the rotating plasma system having the type designation RD 1004 made by Plasmatreat® according to the European Patent Specification EP 1 067 829 B1, which is preferably used for carrying out the method according to the invention and which, unlike vacuum plasma systems, operates with normal air at ambient air pressure (so-called "APAP" apparatus ("Atmospheric-Pressure-Air-Plasma Apparatus).

A plasma system 1 comprises, inter alia, a plasma nozzle 2 having a holder 3 which accommodates a substantially hollow-cylindrical nozzle head 4 having an inclined outlet opening 5 for exit of a club-shaped plasma jet 6 which is rotatable about a longitudinal axis 7. The nozzle head 4 has a tapered section 8 on the underside, which incorporates the outlet opening 5 forming the actual nozzle for the plasma jet 6. The outlet opening 5 has a diameter of about 4 mm. The tapered section 8 has a diameter of about 20 mm whilst the distance 10 between the longitudinal axis 7 and an imaginary plasma jet axis 11 at the outlet opening 5 is about 6 mm. Located underneath the plasma nozzle 2 is a surface 12 of a component to be activated by means of the plasma nozzle 2.

As a result of comprehensive investigations conducted by the applicant, it has been found that for optimal activation results of the surface 12, in particular with regard to the complex material combination present in the vertical tail plane, a distance 14 of 8 mm should be maintained between the plasma nozzle 1 and the surface 12 of the component 13. As a result of the rotating nozzle head 4, a circular region of action 15 of the plasma jet 6 having a radius 16 is initially obtained in the region of the surface 12 of the component 13 when the nozzle is at rest, i.e. at a feed rate of $V_X$ of the plasma nozzle 2 of 0 m/min. However, if the plasma nozzle 1 is moved in the direction of the white arrow 17 at the feed rate or travel rate $V_X$, a so-called cycloid is obtained as a resultant trajectory of the plasma jet 6 which ensures uninterrupted plasma treatment of the surface 12. As a result of the tests which have been conducted, it has also been established that a value of 2,890 revolutions/min at a horizontal feed rate $V_X$ of 20 m per minute must be selected for the rotational speed of the rotating nozzle head 4, which gives a resulting relative speed of about 80 to 120 m per minute between the rotating nozzle head 4 and the surface 12. The distance 14 of preferably 8 mm and the speed $V_X$ of 20 m per minute should preferably be kept constant over the entire treatment time of the surface 12 in order to achieve optimal activation results and at the same time prevent any thermal damage to the surface which would lead to the formation of adhesion-reducing "molecular debris". In order to achieve optimal adhesion results for polymer coatings to be applied, the surface 12 should be subjected to at least a single, preferably a three- to fivefold plasma treatment with the previously mentioned process parameters.

A vertical feed rate $V_Y$ not provided with a reference numeral, whose velocity vector runs perpendicularly into the plane of the drawing in FIG. 1, is usually zero since the rotating nozzle head of the plasma nozzle 2 is moved along parallel, rectilinear tracks at the velocity $V_X$ and the plasma nozzle is only moved in the y-direction at the velocity $V_Y$ at the end points of the tracks, wherein the direction of movement of the plasma nozzle 2 is reversed and a meander-shaped trajectory is obtained so that the surface 12 can be covered without interruption. A (track) distance between the parallel trajectories of the nozzle head is about 20 mm in order to achieve an optimal effect of the plasma jet 6 on the surface 12 in connection with the explained nozzle geometry. Unlike the meandering track pattern which has been explained, arbitrary trajectories can be traveled by means of the plasma nozzle 2 and a suitable handling device which is freely positionable in space.

Furthermore, the plasma system 1 has an electric (high-frequency) generator 18 which is electrically connected to an electrode 19 disposed in the interior of the nozzle head 4 and to the holder for the nozzle head 4, and an air supply unit not shown in detail, by which means an air stream 20 to be ionised is injected into the holder 3 or the nozzle head 4. The voltage at the electrode 19 lies in a range between 5 to 15 kV, which gives a plasma power between 0.5 and 1.0 kW. The air stream fed into the plasma nozzle 2 is about 900 to 2,000 l/h, the plasma jet velocity is about 120 to 300 m/s, giving a static gas temperature in the plasma jet 6 at the outlet opening 5 between 70° C. and 1,000° C. For further technical details reference is made to the said European patent specification and the Plasmatreat® documentation. Apparatus for extracting ozone can be provided in the area of the plasma nozzle 2.

In addition, the plasma system 1 generally has a handling device, not shown, for example, in the form of a standard buckling arm robot having at least six degrees of freedom by which means the plasma nozzle 1 can be positioned and moved freely in space in relation to the component 13, controlled by a control and/or regulating device. Alternatively a portal arrangement can be used as a handling device, particular in the case of a large-sized component 13. The process parameters according to the invention can be maintained highly accurately and reliably reproduced by means of the handling device.

A punctiformly acting plasma nozzle has proved to be suitable in particular for activating connection elements such as, for example, rivets, screws or bolts. In this context with a stationary nozzle in relation to the surface, the concept of the punctiformly acting plasma nozzle defines an approximately circular region of action having a diameter of up to 10 mm on the surface to be activated. Compared with the previously described rotating plasma nozzle, a substantially punctiformly acting plasma nozzle achieves a more incomplete coverage of the surface region to be activated but can produce a higher activation energy in the treated surface region, which is particularly advantageous with connection means which have a comparatively small area compared to the remaining vertical tail plane. Suitable for use within the framework of the method according to the invention is, for example, the substantially punctiformly acting plasma nozzle "Plasma Blaster MEF®" whereby a treatment width of about 10 mm is achieved at a distance between 3 mm and 25 mm from the surface to be activated and at a relative nozzle velocity of up to 300 m/min in relation to the surface. In this case, the static gas temperature in the plasma jet in the region of the outlet opening is at most 300° C. A plurality of substantially punctiformly acting plasma nozzles can be arranged in a matrix form, for example, for activating a larger number of fastening elements.

Figure 2:
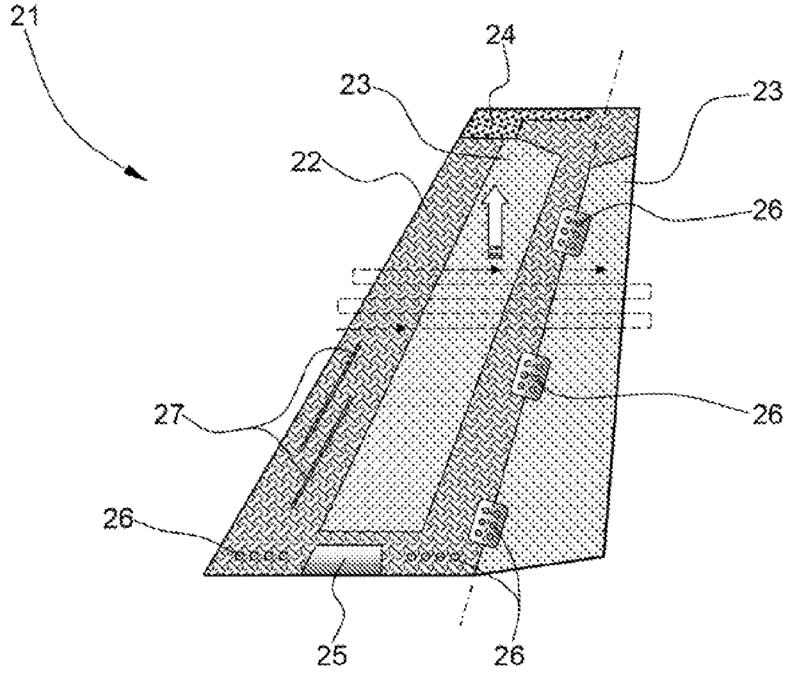
FIG. 2 shows a schematic diagram of an aircraft vertical tail plane.

FIG. 2 illustrates the structure of an aircraft vertical tail plane in a schematic side view.

A pre-fabricated vertical tail plane 21 (so-called "SLW") comprises a region 22 which is coated with an anti-static paint and an adjoining region 23 which is provided with an undercoat or a filling varnish for pore filling, an adhesive paint and/or a base coat. This undercoat (so-called "primer" or "basic primer") can partially and/or completely fulfil the functions of a filling varnish, an adhesive paint (adhesion promoting) and that of a base coat.

One region 24 of the vertical tail plane 21 is provided with an anti-erosion paint and one region 25 is at least partially of a metallic nature and is formed, for example, from a metal sheet of an aluminium alloy material, a stainless steel alloy material and/or a titanium alloy material. The metal regions are usually likewise provided with a functional surface coating. Pre-fabricated aluminium alloy sheets are usually subjected to a pre-treatment by chromic acid anodization ("CAS method") and subsequent coating with an undercoat or primer.

In addition, the vertical tail plane 21 has a plurality of further functional groups, for example, a plurality of usually metal connection elements or connection means 26 which are usually likewise formed from a metal material as specified above. The connection means usually comprise rivets, bolts or screws which are partially integrally combined with washers, fan washers or split washers and which usually, depending on the material and/or the intended use have a conversion layer such as, for example, chromic acid anodization, sulphuric acid anodisation or a polymer coating (so-called "high coat"). Finally, the vertical tail plane 21 has a plurality of sealing joints 27 which are usually formed using elastic, polysulphide-based plastic materials.

In the context of the present application, anti-static paints, filling varnishes, undercoats, adhesive paints (adhesion promoters), anti-erosion paints, top coats as well as decorative paints are understood equally by themselves or in combination of at least two of these paints as a (complex) polymer coating (ply or layer structure of the polymer coating). In addition, self-adhesively equipped films can also be used as a possible polymer coating of the vertical tail plane 21. The body or the "naked" completely uncoated base body of the vertical tail plane 21 is substantially formed from carbon-fibre-reinforced epoxy resins and at least in certain areas, aluminium, stainless steel and titanium sheets. Surface regions of the vertical tail plane 21 formed from aluminium alloy sheets are, for example, usually subjected to a chromic acid anodisation on the prefabrication side and then treated with a base primer (so-called "inner base coat") which is provided with another primer (so-called "outer base coat") in another painting step which optionally takes place differently.

In the prefabrication state of the vertical tail plane 21, a plurality of further polymer coatings are usually located underneath the anti-static paint, the undercoat and the anti-erosion paint so that the polymer coating of the vertical tail plane 21 in its entirety is an extremely complex paint and sealing joint structure constructed with a generally different number of different types of paint or polymer layers in certain areas.

An exemplary combination of paints or paint systems which can be used on the vertical tail plane 21 which were subjected to the method of plasma treatment according to the invention are given in the following table:

| Paint systems or polymer coatings | | | | |
|---|---|---|---|---|
| Type | Abbrev. | Type | Manufacturer | Manufacturer designation |
| "Inner base coat" | P | Undercoat (primer, prime coat, adhesive paint, filling varnish) | Mankiewicz ® | Alexit ® 343-21 (PUR) or Alexit ® 313-02 (EP) |
| | PS' | Undercoat (primer, prime coat, adhesive paint, filling varnish) | Mankiewicz ® | Seevenax ® 113-82 |
| "Outer base coat" | PS" | Undercoat (primer, prime coat, adhesive paint, filling varnish) | Aviox ® | Aviox ® CF Primer |
| | PS"' | Undercoat (primer, prime | PPG ® | PPG CS Primer |

-continued

| Paint systems or polymer coatings | | | | |
|---|---|---|---|---|
| Type | Abbrev. | Type | Manufacturer | Manufacturer designation |
| | | coat, adhesive paint, filling varnish) | | |
| “Inner coat” | 0986 | Anti-static paint (functional paint) | PPG ® | 0986/2620 |
| | Celoflex ® | Anti-static paint (functional paint) | PPG ® | Celoflex ® 95 |
| “Outer coat” | Alexit D | “Top coat” | Mankiewicz ® | Alexit ® 406-82 |
| | Aviox | “Top coat” | Aviox ® | Aviox ® top coat |
| | PPG | “Top coat” | PPG ® | PPG ® top coat |

From this, for example surfaces (substrates) having the following coating combinations were formed and then treated according to the plasma method according to the invention:

Aviox® CF Primer [PPG® CA Primer]+Aviox® top coat [PPG® top coat]+P

Aviox® CF Primer [PPG® CA Primer]+Aviox® top coat [PPG® top coat]+P+0986

Aviox® CF Primer [PPG® CA Primer]+Aviox® top coat [PPG® top coat]+0986+Celoflex®95

Aviox® CF Primer [PPG® CA Primer]+Aviox® top coat [PPG® top coat]+PS+Alexit® D

These coating combinations had been partially provided with a so-called “standard dirt” or with “standard fingerprints” in order to study the cleaning effect of the plasma treatment compared with a normal pre-cleaning process (washing) using a chemical solvent such as, for example, isopropanol. All the coatings for studies had usually been subjected to artificial ageing for one year.

The substrates were subjected to the plasma treatment according to the invention, the process parameters being varied in each case to determine the optimum.

Figure 5:
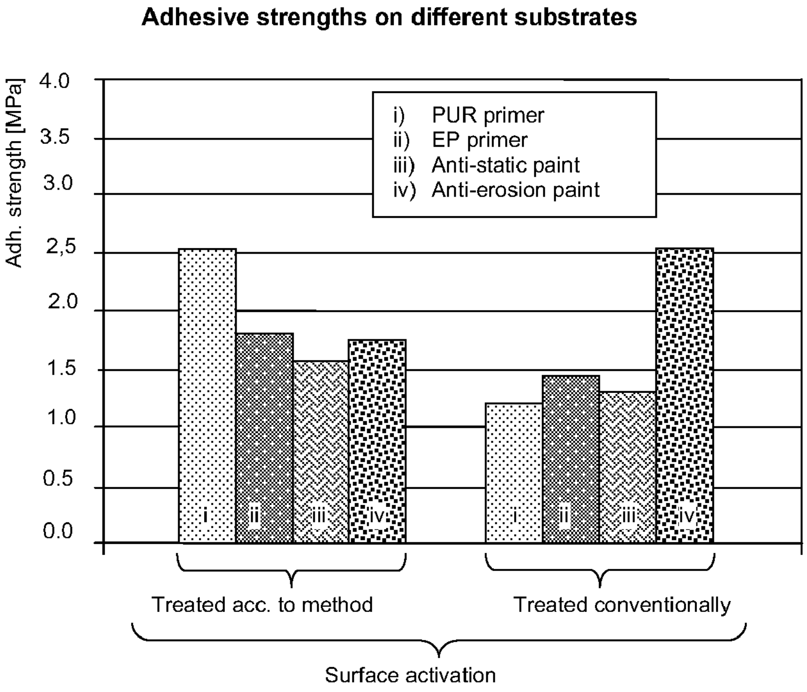

Finally, for example, coating with an undercoat (e.g. CF-Primer 37124 AKZO) or a top coat (e.g. Top Coat Aviox® 77702) is carried out to determine the mechanical adhesive strengths achieved as a result of the plasma pre-treatment (cf. in particular FIG. 5). In principle, a plurality of different polymer coatings can be used on the vertical tail plane 21, in particular in regions having different base materials such as, for example, aluminium alloy sheets or carbon-fibre-reinforced plastic regions, which in turn are made up of a plurality of superposed polymer (intermediate) layers. Purely metallic sections of the vertical tail plane 21 can be pre-coated at the manufacturers with a “CAA” coating (so-called “Chromatic Acid Anodisation) to which the polymer coatings listed hereinbefore can then in turn be applied alone or in any combination of at least two components.

For example, a sealing compounds having the type designation “PR 1782” made by PPG and a sealing compound “MC 780” made by Chemetall is suitable for producing the sealing joints 27 in the region of the vertical tail plane 21.

For example, “Hi-Lok DAN 8 Titan VE” elements can be used as connection or fastening means.

Furthermore, a plurality of aluminium solid rivets in accordance with DIN 65399-32 “NAS1102E3-L washer/screw combinations” as well as “DAN 169 E3 washer/screw combination” can usually be used as connection means 26 or connection elements on the vertical tail plane 21.

By blasting the vertical tail plane 21 with carbon dioxide snow, not shown in FIG. 2, the connection means 26 can be conditioned in such a manner that a subsequent activation by means of the plasma treatment according to the method is possible. The plasma treatment is carried out in this case by guiding the plasma nozzle 2 along the meandering track indicated by the dashed line in FIG. 2 over the surface of the entire vertical tail plane 21 whilst maintaining the said process parameters.

Only in the case of connection means formed from a titanium alloy and subjected to a sulphuric acid anodisation, can these connection means not be activated by a plasma treatment to improve adhesion after blasting with carbon dioxide snow. However, connection elements made of metal alloys, provided with a polymer coating can easily be activated by means of the method according to the invention to improve adhesion. Consequently, the process step in the form of blasting with $CO_2$, snow is only necessary when connection means made of an aluminium alloy and/or of a stainless steel alloy are to be activated by means of the plasma treatment according to said method to improve adhesion.

Figure 3:
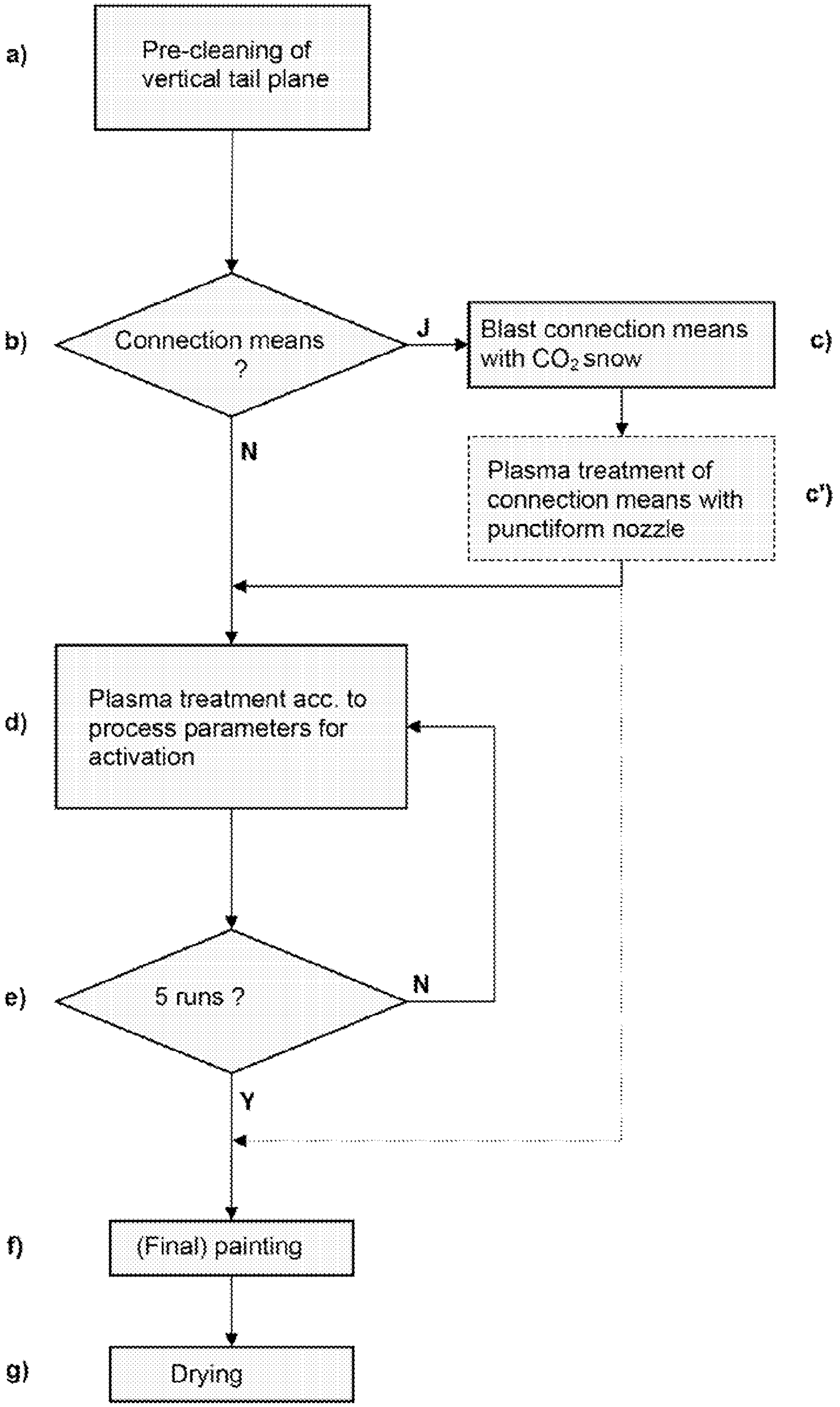
FIG. 3 shows a highly simplified flow diagram of the method according to the invention.

FIG. 3 shows a highly simplified schematic fundamental process sequence. Firstly, in the first process step a), an optional pre-cleaning of the vertical tail plane 21 takes place, which can be effected for example by washing with isopropanol alcohol.

In a first interrogation step b) it is then checked whether connection means are present in the region to be coated with a polymer. If this is the case, in an intermediate step c) at least the relevant region is blasted with $CO_2$, snow, then in an optional intermediate step c'), a plasma treatment can be carried out using at least one punctiformly acting plasma nozzle, Following the punctiform plasma treatment of the connection elements, the remaining areas of the vertical tail plane 21 can be activated in process step d) by means of the rotating plasma nozzle. In this case, in the following process step d) the fastening means which have already been treated by means of the punctiform plasma nozzle can additionally be subjected to the plasma treatment according to the invention by means of the rotating plasma nozzle. After passing through a further interrogation step e), process step d) is repeated at least three times, but preferably at least five times in order to achieve sufficient activation and associated optimal adhesion of the polymer coating to be applied. In process step f) the polymer coating is finally applied, comprising for example at least one paint or at least one paint system according to the table given further above. The paint can be applied by means of conventional processes, for example, using a spray gun, a brush or a roller. Alternatively, electrostatic methods or dipping methods can also be used for applying paint. In addition, especially in areas which are only slightly curved, the polymer coating can be applied by applying films and/or self-adhesive films at least in certain areas. The films can be formed by a polymer and/or by a metal material which is optionally provided with a fibre reinforcement at least in certain areas.

In the last process step g) the paintwork on the vertical tail plane 21 is dried by means of a known method. The drying can take place, for example in heated or suitable temperature-controlled halls having large-area infrared emitters, hot air blowers, inductively in the case of conductive substrates or by any combination of the said measures.

The method according to the invention allows the vertical tail plane 21 composed of a complex material mix to be activated for the first time by means of plasma activation with uniform process parameters.

Figure 4:
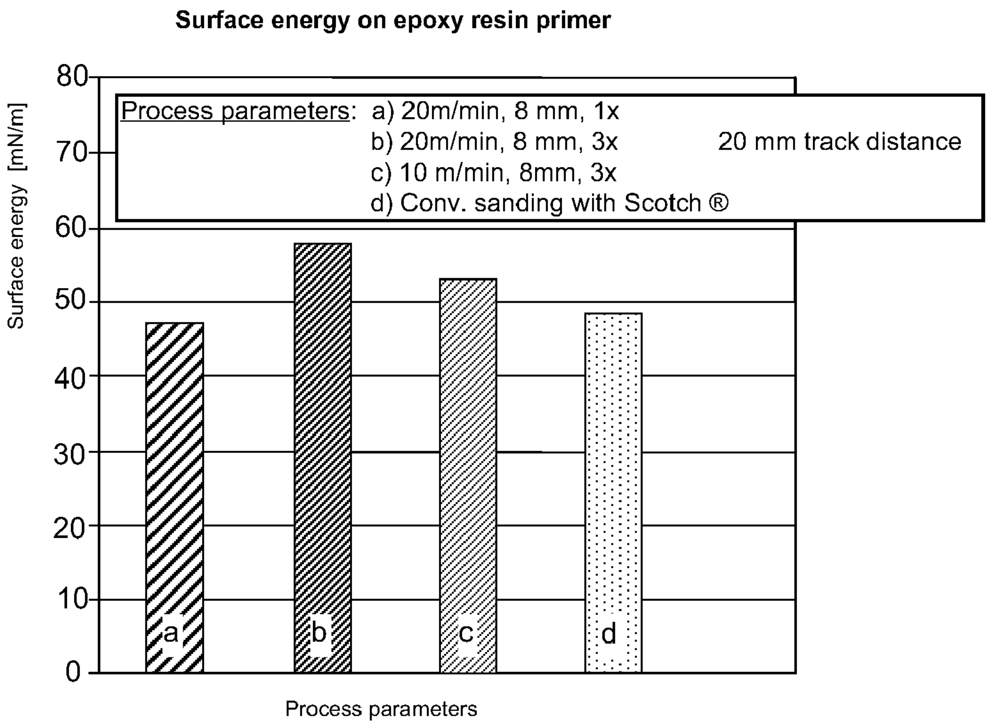
FIG. 4 shows a diagram with surface energies produced by different process parameters on a surface coated with an epoxy resin primer and FIG. 5 shows a simplified diagram of adhesive strengths on surfaces treated according to the method compared to conventionally treated (sanded) surfaces.

FIG. 4 shows a graph showing surface energies which can be achieved by treating a component which has been treated, for example, with an epoxy resin primer, according to said method. The surface energy which is an index for an attainable mechanical adhesion of a polymer coating on the treated surface of the component is composed of a polar and a disperse fraction. The polar fraction comprises the dipole-dipole interaction, interaction by hydrogen bridge bonds and Lewis acid-base interaction whilst the disperse fraction is primarily caused by the Van der Waals interaction. The polar and the disperse fractions have been combined in the graph for the sake of better diagrammatic clarity.

In the diagram in FIG. 4, column a) shows the surface energy which can be attained by means of the method on a surface treated with an epoxy resin primer (cf. Table further above, "Alexit 313-02" (epoxy resin based)) at a feed rate of 20 m/min and a nozzle distance of 8 mm and a single process run whilst column b) gives the attainable surface energy at a feed rate $V_X$ of 20 m/min, 8 mm nozzle distance and three process runs. Column c) represents the attainable surface energy at a feed or travel rate of 10 m/min with otherwise unchanged process parameters. For comparison column d) illustrates the surface energy which is achieved by means of a surface treatment by treatment with a Scotch® abrasive conventionally used for pre-treatment. It can be seen from the diagram that an increase in the number of process runs (cf. columns b) and c)) has a greater influence on the attainable surface energy than a reduction in the feed rate (cf. column c)). A comparison of the surface energies achieved in columns a)-c) with the sanding treatment in column d) shows that compared to the conventional sanding treatment; a comparable, if not even higher adhesion to a polymer coating to be applied can be achieved by means of the plasma treatment according to the said process.

A measurement of the effective mechanical adhesive strength of a polymer coating on a surface or area of a component can be carried out for example by a right angle lattice pattern in accordance with ISO 2409. Alternatively, the adhesive strength can also be measured by means of front peeling. This measurement is made by sticking a stamp onto the polymer coating, whose adhesive strength is to be determined and then peeling the stamp until it detaches by means of a tensile testing machine according to DIN 53 232 or DIN ISO 4624.

FIG. 5 illustrates a simplified diagram of adhesive strengths on four surfaces activated according to the method compared with four identical but conventionally treated or pre-treated surfaces, that is, sanded and washed with isopropanol.

The measurements of the adhesive strength were made using the front peeling method and the right angle lattice pattern method in a plurality of series of measurements. The surfaces i) to iv) activated in each case by different processes have as the uppermost (last) adhesion-relevant layer a PUR primer (i), an epoxy resin primer (ii), an anti-static paint (iii) and an anti-erosion paint (iv) (cf. on this matter the Table further above).

The surfaces i) to iii) thus activated were coated with a primer (type designation "FP primer 37124 AKZO") and the surface iv) was coated with the top coat ("Top Coat", type designation "Topcoat Aviox 77702") in order to determine the adhesive strength of these two polymer layers on the substrates which had previously been activated according to the process. The left-hand four columns show the adhesive strengths measured after the plasma treatment according to the invention on the four substrates i) to iv) whilst the right-hand four columns show the measured adhesive strengths on the same but sanded substrates i) to iv). In all cases, the treatment according to the said method was carried out using the plasma rotating nozzle having the process parameters 20 m/min, 8 mm nozzle distance, 20 mm track distance and repetition three times. In the case of the conventional treatment, cleaning with isopropanol was carried out before and after the sanding process (Scotch®) in each case whereas in the case of the plasma treatment according to the invention, a pre-cleaning with ethanol was merely carried out before the activating by means of the rotating plasma nozzle.

Furthermore, extensive investigations made by the applicant have shown that the age of the polymer coatings is not a significant factor for the efficiency of the plasma activation. This circumstance is particularly important when otherwise prefabricated components which have already been provided with an undercoat or primer and/or with an anti-erosion and/or anti-static paint are to be pre-treated by means of the method according to the invention with a time delay.

The diagram in FIG. 5 shows that in particular the adhesive strengths attainable by means of the method according to the invention are approximately independent of the substrate and at least attain the adhesive strengths achieved by conventional sanding, even exceeding these in isolated cases.

| Reference list | |
|---|---|
| 1 | Plasma system |
| 2 | Plasma nozzle |
| 3 | Holder |
| 4 | Nozzle head (rotating) |
| 5 | Outlet opening |
| 6 | Plasma jet |
| 7 | Longitudinal axis |
| 8 | Section (nozzle head) |
| 9 | Diameter |
| 10 | Distance (eccentricity of the outlet opening) |
| 11 | Plasma jet axis |
| 12 | Surface |
| 13 | Component |
| 14 | Distance (plasma nozzle/surface component) |
| 15 | Area of action (plasma jet) |
| 16 | Radius (area of action) |
| 17 | Arrow (speed $V_X$) |
| 18 | Generator |
| 19 | Electrode |
| 20 | Air stream |
| 21 | Vertical tail plane |
| 22 | Region (anti-static paint) |
| 23 | Region (undercoat (filling varnish, adhesive paint, base coat)) |
| 24 | Region (anti-erosion paint) |
| 25 | Region (metal sheet) |
| 26 | Connection means or element (rivet/bolt) |
| 27 | Sealing joint |

What is claimed is:

1. A method for plasma treatment and painting of a surface; the surface including a plurality of different materials, comprising:

blasting the surface with a carbon dioxide snow so as to activate the surface to improve an adhesive strength;

treating the surface with a plasma treatment using at least one rotating plasma nozzle combined with at least one punctiformly acting plasma nozzle following the blasting step, the treating including guiding each plasma nozzle at a distance of not more than 15 mm from the surface at a feed rate of not more than 50 m/min; and painting the surface.

2. The method as recited in claim 1, wherein the surface is a vertical tail painting of an aircraft.

3. The method as recited in claim 1, wherein the surface includes at least one of a. plurality of connection means and sealing joints, and wherein the plurality of different materials includes at least one of carbon fibre reinforced materials and metallic materials.

4. The method as recited in claim 3, wherein the blasting is performed in a region of the plurality of connection means.

5. The method as recited in claim 1, wherein the at least one rotating plasma nozzle includes at least one nozzle head disposed in a holder; and wherein the treating includes rotating the at least one nozzle head in the holder at a rotational speed if up to 3,600 rpm.

6. The method as recited in claim 5, further comprising partially providing the surface with at least one polymer coating at least in certain areas before the treating step.

7. The method as recited in claim 6, wherein the at least one polymer coating is at least one of a filling varnish, a primer, an antistatic paint, an anti-erosion paint, a top-coat lacquer, a decorate lacquer and a sealing joint.

8. The method as recited in claim 5, wherein the guiding includes guiding the holder above the surface along parallel, rectilinear tracks and reversing a direction of movement of the at least one plasma nozzle at a track end while holding a direction of rotation of the at least one nozzle head constant.

9. The method as recited in claim 1, wherein the treating step is repeated at least once.

10. The method as recited in claim 9, wherein the treating step is repeated at least three times.

11. The method as recited in claim 1, further comprising pre-cleaning at least a portion of the surface before the treating step.

12. The method as recited in claim 11, wherein the pre-cleaning is performed using a chemical solvent so as to remove contaminants.

13. The method as recited in claim 1, wherein the treating step is performed at atmospheric pressure.

14. The method as recited in claim 13, wherein the treating is preformed in an atmosphere including air.

15. The method as recited in claim 1, further comprising applying at least one polymer coating to the surface following the blasting step within an open time of not more than 20 h.

16. The method as recited in claim 15, wherein the open time is not more than 2 h.

17. The method as recited in claim 15, wherein the at least one polymer coating includes at least one of a filling varnish, a primer, an antistatic paint, an anti-erosion paint, a top-coat lacquer, a decorative lacquer and a sealing joint.

18. The method as recited in claim 15, wherein the applying includes applying the at least one polymer coating in a lowest possible viscosity state directly after opening a container.

* * * * *